US011435795B1

(12) United States Patent
He et al.

(10) Patent No.: US 11,435,795 B1
(45) Date of Patent: Sep. 6, 2022

(54) EMI SHIELD SYSTEM AND METHOD FOR HYPERBARIC FAN COOLING SYSTEMS

(71) Applicant: Dell Products L.P., Round Rock, TX (US)

(72) Inventors: Qinghong He, Austin, TX (US); Allen B. McKittrick, Cedar Park, TX (US); Changsoo Kim, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 29 days.

(21) Appl. No.: 17/230,487

(22) Filed: Apr. 14, 2021

(51) Int. Cl.
*G06F 1/20* (2006.01)
*H05K 7/20* (2006.01)
*G06F 1/18* (2006.01)

(52) U.S. Cl.
CPC .............. *G06F 1/203* (2013.01); *G06F 1/182* (2013.01); *H05K 7/20172* (2013.01)

(58) Field of Classification Search
CPC ........ G06F 1/1656; G06F 1/1658; G06F 1/20; G06F 1/206; G06F 1/203; G06F 1/182; G06F 2200/201; H05K 2201/10371; H05K 7/20172; H05K 1/0203; H05K 1/0216; H05K 7/20436; H05K 9/0024; H05K 9/0071; H05K 9/0073; H05K 1/0243; H05K 1/181; H01L 23/552; H01L 2924/3025; H01L 23/36
See application file for complete search history.

(56) References Cited

U.S. PATENT DOCUMENTS

| | | | | |
|---|---|---|---|---|
| 5,237,486 A | * | 8/1993 | LaPointe | G06F 1/203 361/728 |
| 5,724,234 A | * | 3/1998 | Phelps | H05K 9/0026 361/801 |
| 6,122,167 A | * | 9/2000 | Smith | H01L 23/427 361/688 |
| 6,255,622 B1 | * | 7/2001 | May | G06F 1/203 219/209 |
| 6,301,107 B1 | * | 10/2001 | Lev | G06F 1/203 361/689 |
| 6,456,504 B1 | * | 9/2002 | LoForte | H05K 5/0269 439/95 |
| 6,853,093 B2 | * | 2/2005 | Cohen | H01L 23/576 257/679 |
| 9,148,966 B2 | * | 9/2015 | Tachikawa | H05K 5/0086 |
| 2002/0093806 A1 | * | 7/2002 | Gough | G06F 1/182 361/816 |
| 2002/0185294 A1 | * | 12/2002 | Shlyakhtichman | H05K 9/0032 174/387 |

(Continued)

FOREIGN PATENT DOCUMENTS

TW M242996 U * 8/2003

*Primary Examiner* — Michael A Matey
(74) *Attorney, Agent, or Firm* — Baker Botts, L.L.P.

(57) ABSTRACT

A cooling system comprises one or more hyperbaric fans and an electromagnetic interference (EMI) shield protecting selected components in a sealed chassis. The EMI shield comprises vents configured to allow airflow through the shield but prevent direct transmission of electromagnetic energy through the EMI shield. Airflow generated by a hyperbaric fan in the sealed chassis is able to flow through the vents to cool components surrounded by the EMI shield and the EMI shield prevents electromagnetic energy generated by some components from interfering with other components.

20 Claims, 10 Drawing Sheets

(56) References Cited

U.S. PATENT DOCUMENTS

| | | | | |
|---|---|---|---|---|
| 2003/0193794 | A1* | 10/2003 | Reis | H05K 9/0026 257/E23.114 |
| 2005/0219832 | A1* | 10/2005 | Pawlenko | H05K 9/0035 361/818 |
| 2009/0207578 | A1* | 8/2009 | Ligtenberg | G06F 1/1616 361/818 |
| 2015/0264842 | A1* | 9/2015 | Song | H01L 23/42 29/840 |
| 2015/0282387 | A1* | 10/2015 | Yoo | H05K 9/0026 361/700 |
| 2015/0282392 | A1* | 10/2015 | Liu | H05K 1/0203 174/377 |
| 2016/0044835 | A1* | 2/2016 | Lee | H05K 9/0032 29/841 |
| 2016/0301442 | A1* | 10/2016 | Sohn | H04M 1/19 |
| 2020/0192438 | A1* | 6/2020 | Chang | H01Q 1/243 |
| 2021/0240239 | A1* | 8/2021 | He | H05K 9/0007 |

\* cited by examiner

EMI SHIELD SYSTEM AND METHOD FOR HYPERBARIC FAN COOLING SYSTEMS

BACKGROUND

Field of the Disclosure

This disclosure relates generally to portable information handling systems and, more particularly, to electromagnetic interference (EMI) shields for hyperbaric fan cooling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A hyperbaric fan cooling system in a portable information handling system provides greater cooling capabilities for the portable information handling system.

SUMMARY

Embodiments disclosed herein may be generally directed to portable information handling systems with hyperbaric fan cooling systems and electromagnetic interference (EMI) shielding.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, component "20-1" may refer to a processing component of an information handling system, which may be referred to collectively as components "20" and any one of which may be referred to generically as component "20."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

In a portable information handling system, EMI shields have become more common in thin laptops because the narrow bezel and thin panel have resulted in designs with the antenna located near the base. The positioning of the antenna near the base requires better radio frequency (RF) noise isolation around components such as CPU, memory, SSD, etc. EMI covers in some systems may fill almost all of the information handling system internal space, leaving no or very limited space for airflow to move around.

Embodiments disclosed herein include portable information handling systems with sealed chassis and hyperbaric fan cooling systems with EMI shields for protecting components from electromagnetic energy.

Embodiments include an EMI shield that encloses high power RF noise emitting components in a way that allows dynamic air flow from a hyperbaric fan to actively go into the shield and around the components underneath it. Embodiments not only open up the space inside the EMI shield for airflow to pass through and carry the heat away resulting in a lower skin temperature but also in a way that not affecting the system design or shielding properties.

Embodiments disclosed herein are described with respect to hyperbaric fan cooling systems in portable information handling systems. Particular embodiments are best understood by reference to FIGS. 1, 2A-2B, 3-5, 6A-6B and 7-8 wherein like numbers are used to indicate like and corresponding parts.

Figure 1:
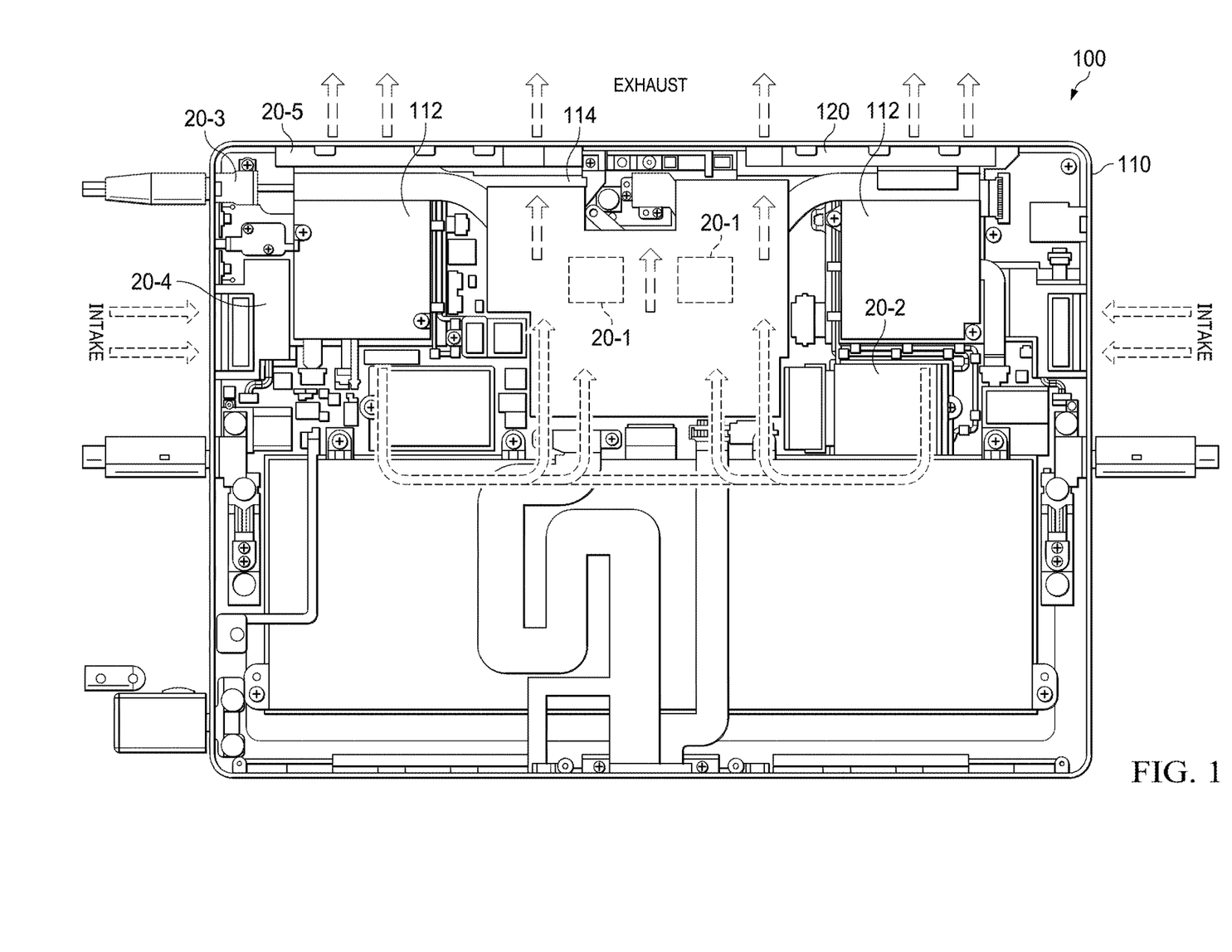
FIG. 1 illustrates a top cutaway view of a chassis of a portable information handling system.

Turning to the drawings, FIG. 1 illustrates a top cutaway view of chassis 110 of portable information handling system 100, depicting components 20 of an embodiment of information handling system 100. It is noted that FIG. 1 is not drawn to scale but is a schematic illustration.

As shown in FIG. 1, information handling system 100 may include a plurality of components 20 of a processor subsystem, which may comprise one or more processors 20-1, memory components 20-2, I/O components 20-3, as well as local storage resource components 20-4 and network interface components 20-5.

Components 20-1 of a processor subsystem may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, components 20-1 of a processor subsystem may interpret and execute program instructions and process data stored locally (e.g., in components of a memory subsystem). In the same or alternative embodiments, components 20 of a processor subsystem may interpret and execute program instructions and process data stored remotely (e.g., in a network storage resource).

Components 20-2 of a memory subsystem may comprise a system, device, or apparatus operable to retain and retrieve program instructions and data for a period of time (e.g., computer-readable media). Components 20-2 of a memory subsystem may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

Components 20-3 of an I/O subsystem may comprise a system, device, or apparatus generally operable to receive and transmit data to or from or within information handling system 100. Components 20-3 of an I/O subsystem may represent, for example, a variety of communication interfaces, graphics interfaces, video interfaces, user input interfaces, and peripheral interfaces. Components 20-3 of an I/O subsystem may be used to support various peripheral devices, such as a touch panel, a display adapter, a keyboard, a touch pad, or a camera, among other examples. In some implementations, components 20-3 of an I/O subsystem may support so-called 'plug and play' connectivity to external devices, in which the external devices may be added or removed while information handling system 100 is operating.

Components 20-4 of a local storage resource may comprise computer-readable media (e.g., hard disk drive, floppy disk drive, CD-ROM, and other type of rotating storage media, flash memory, EEPROM, or another type of solid-state storage media) and may be generally operable to store instructions and data.

Components 20-5 of a network interface may be a suitable system, apparatus, or device operable to serve as an interface between information handling system 100 and a network (not shown). Components 20-5 of a network interface may enable information handling system 100 to communicate over a network using a suitable transmission protocol or standard. In some embodiments, components 20-5 of a network interface allow components 20 of information handling system 100 to communicate wirelessly to other information handling systems 100, printers and equipment. A network coupled to components 20-5 of a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to components 20-5 of a network interface may be implemented using hardware, software, or any combination thereof.

Components 20-5 of a network interface may include a main antenna 20-5 configured for wireless communication between information handling system and a network. In some embodiments, components 20 of information handling system 100 may include a Wi-Fi antenna 20-5 for Wi-fi communications. In some embodiments, components 20 of information handling system 100 may include an antenna 20-5 for LTE (long-term evolution) communications over a cellular network.

Components 20 may generate electromagnetic energy in the process and the electromagnetic energy may cause electromagnetic interference (EMI) with other components 20. In portable information handling systems 100, as the size of chassis 110 decreases and components 20-1 generate higher powered radio frequency (RF) noise, the EMI emitted by components 20-5 is more likely to negatively affect performance of other components 20 of information handling system 100 such as antennas 20-5.

To overcome these deficiencies, embodiments disclosed herein comprise a cooling system comprising one or more hyperbaric fans 112 for generating airflow through sealed chassis 110 and an EMI shield 114 to protect components 20 of portable information handling systems 100 from electromagnetic interference and including vents to increase cooling of components 20 of information handling system 100. In some embodiments, hyperbaric fans 112 comprise dual-opposed outlet (DOO) fans capable of generating an airflow and distributing the airflow between two or more fan outlets.

Figure 2A:
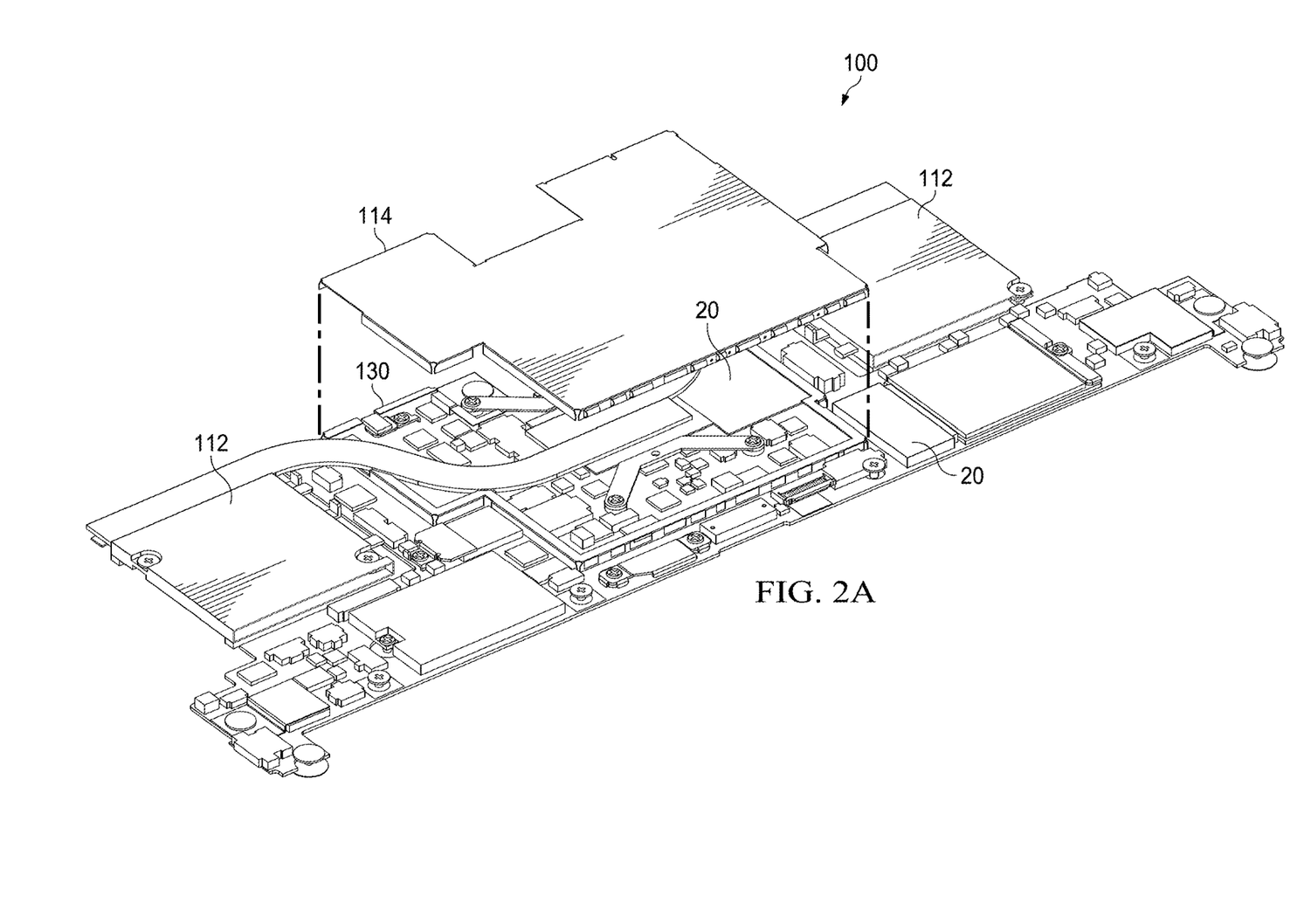
FIG. 2A depicts a perspective view of a portable information handling system with an EMI shield positioned relative to components of portable information handling system.

FIG. 2A depicts a perspective view of information handling system 100 comprising components 20 of a processor subsystem, a memory subsystem, an I/O subsystem, a local storage resource and a network interface with hyperbaric fans 112 for generating airflow through chassis 110 and EMI shield 114 positioned relative to components 20 in chassis 110.

Figure 2B:
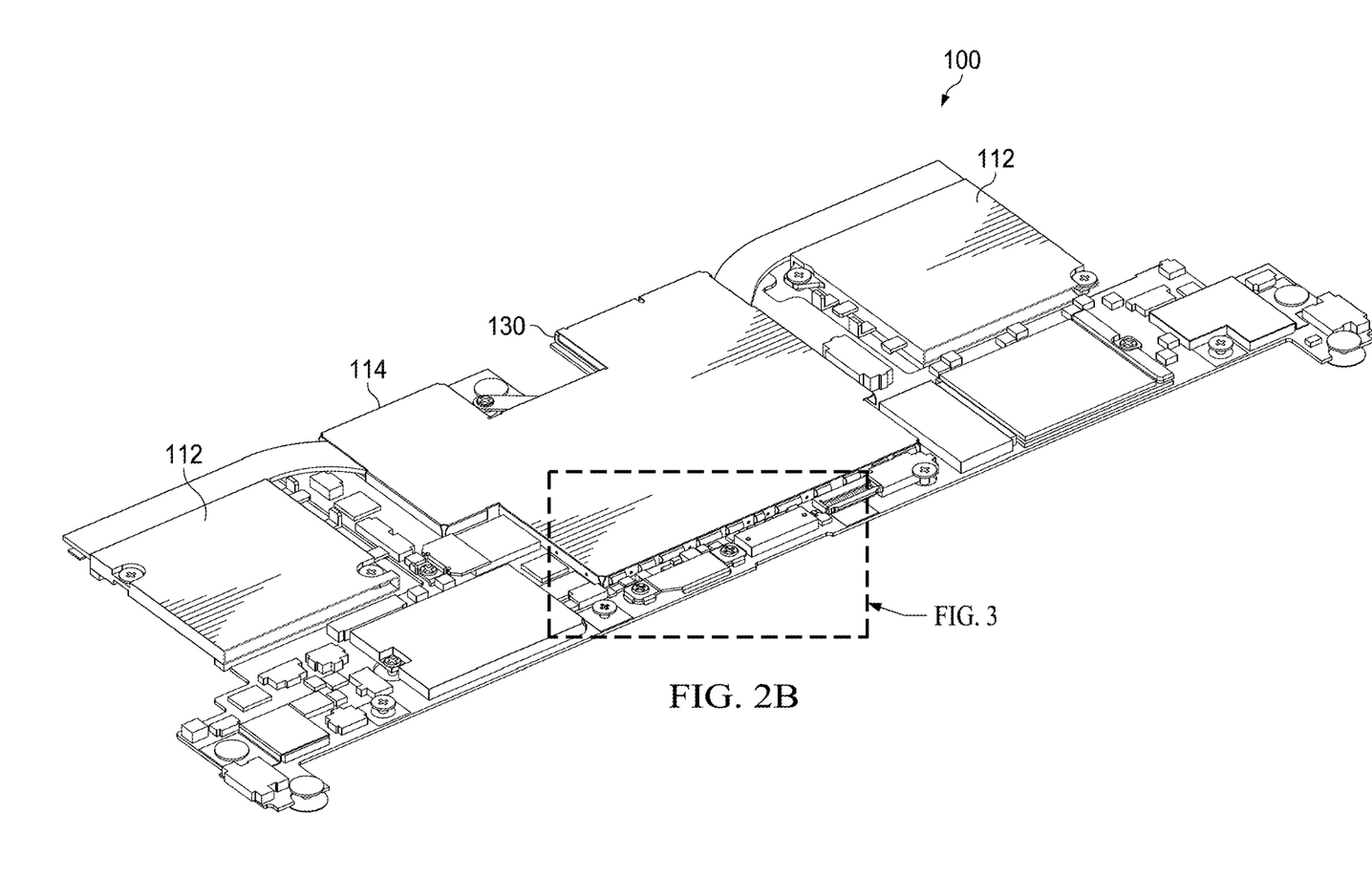
FIG. 2B depicts a perspective view of a portable information handling system with an EMI shield positioned to protect components of portable information handling system from EMI.

FIG. 2B depicts a perspective view of a portable information handling system 100 of FIG. 2A with hyperbaric fans 112 for generating airflow through chassis 110 and EMI shield 114 positioned to protect components 20 of portable information handling system 100 from EMI but allow airflow to cool all components 20 in chassis 110.

Figure 3:
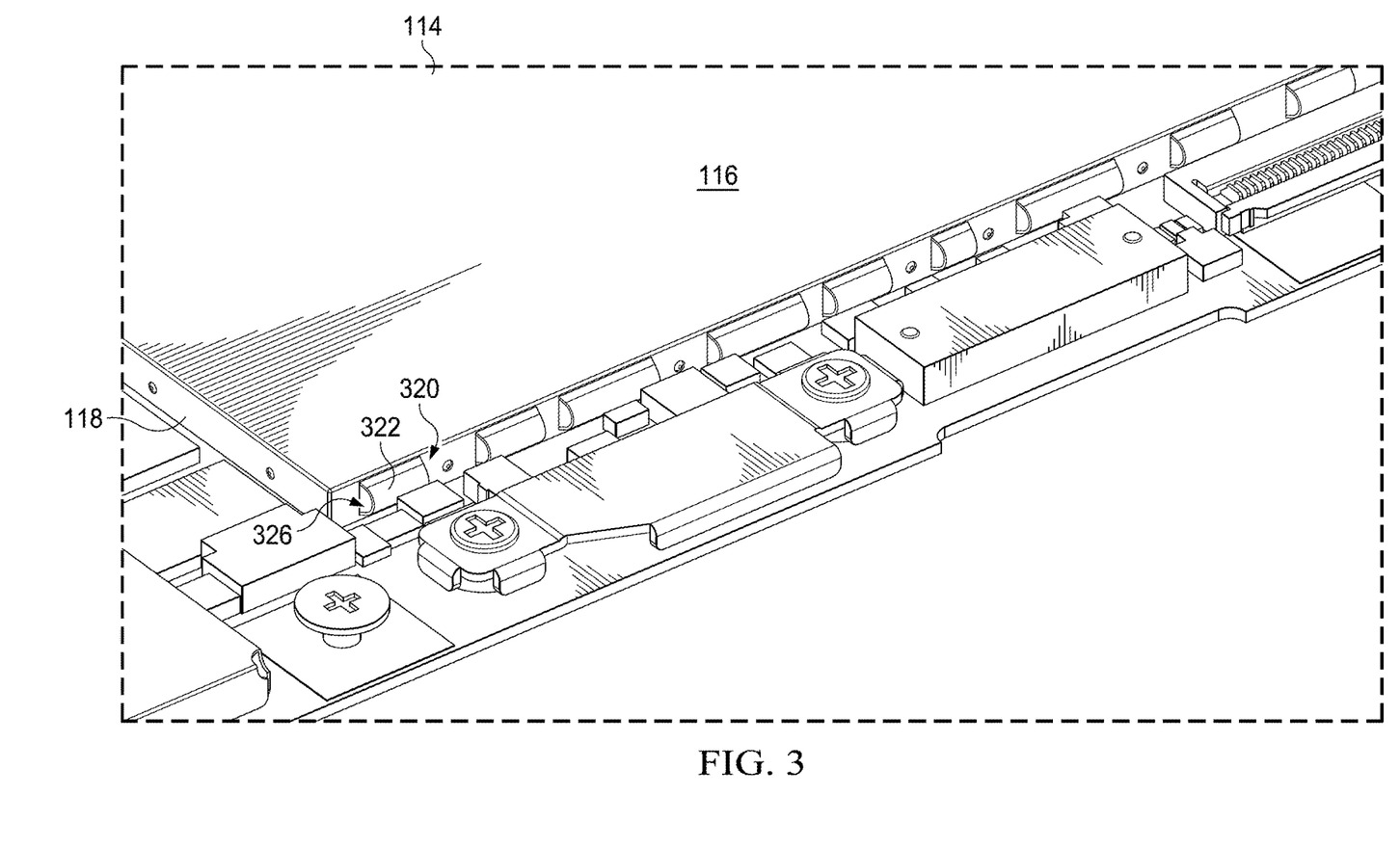
FIGS. 3-5 depict partial perspective views of information handling system with embodiments of an EMI shield.
Figure 4:
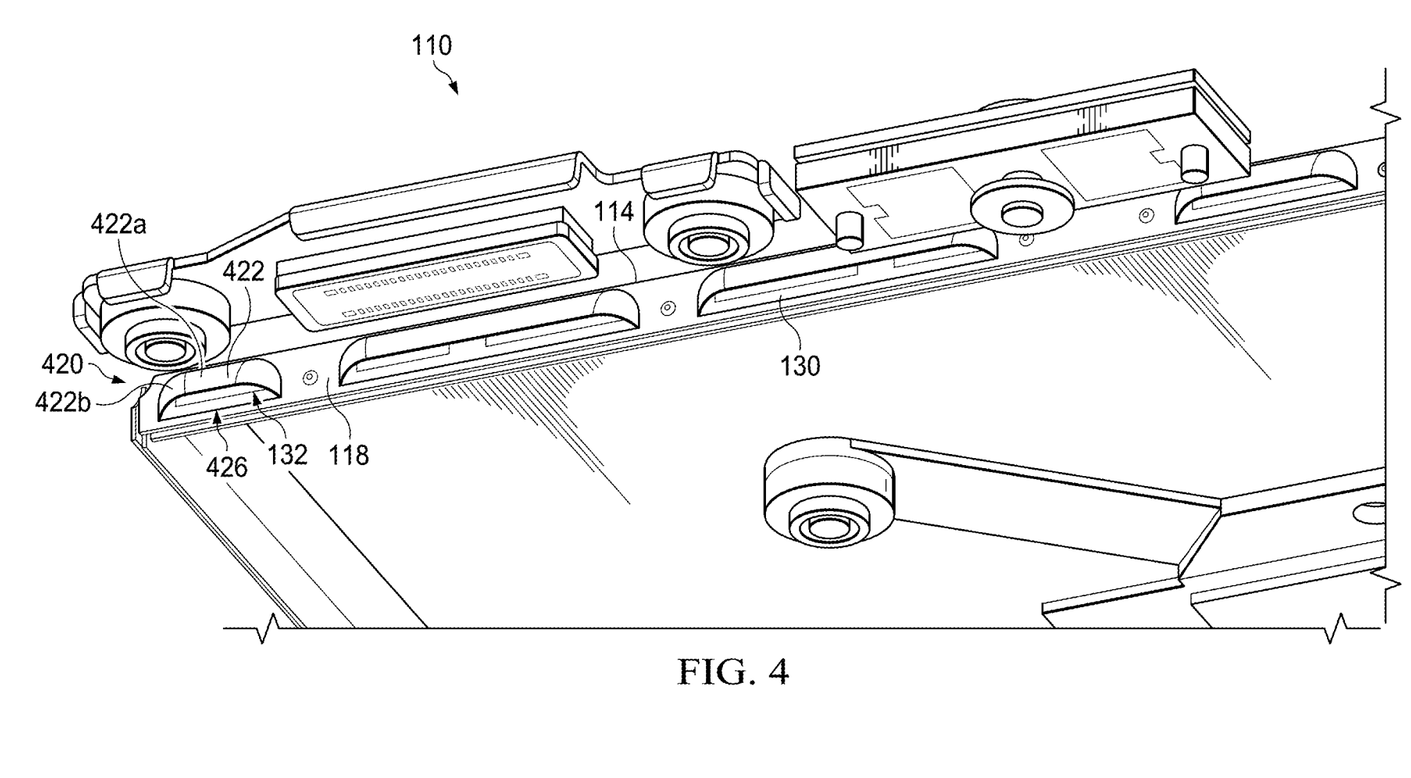
Figure 5:
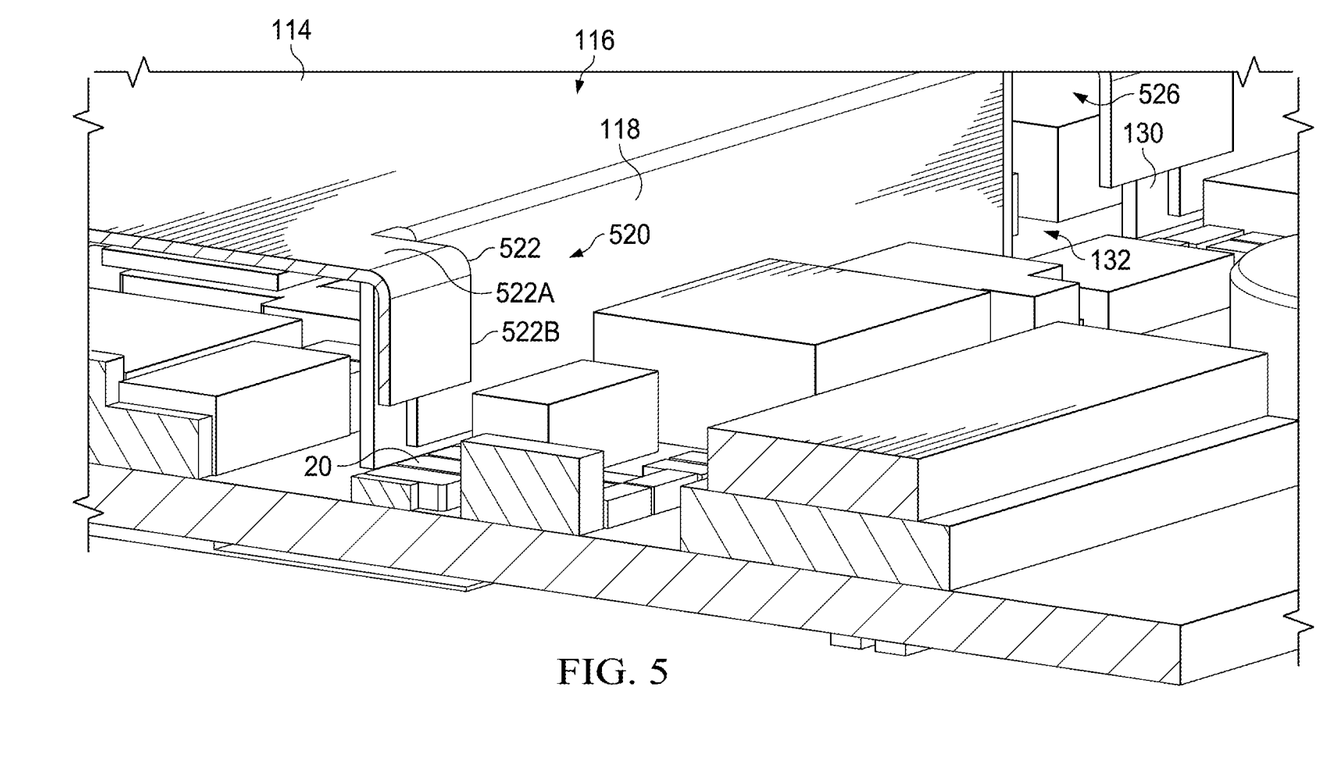

FIGS. 3-5 depict partial perspective views of information handling system with embodiments of EMI shield 114. EMI shield 114 may be formed from a material configured to prevent electromagnetic energy transmission. EMI shield 114 may comprise a continuous top surface 116 and a plurality of side surfaces 118. In some embodiments, EMI shield 114 may be configured for positioning relative to a frame 130 (not visible in FIG. 3).

Referring to FIG. 3, vent 320 may be formed in side surface 118 of EMI shield 114 with tab 322 extending from top surface 116 or side surface 118 at an angle such that airflow may pass through opening 326 but tab 322 may prevent electromagnetic energy emitted by components 20 from entering or exiting opening 326. Tab 322 may be generally straight and extend at an angle or may be curved as depicted in FIG. 3. Vent 320 may be configured to allow airflow from below or around tab 322 to allow airflow from the bottom or side of vent 320.

Referring to FIG. 4, vents 420 may be formed in one or more side surface 118 of EMI shield 114. Each vent 420 may comprise tab 422 formed with first portion 422A extending from top surface 116 and second portions 422B extending from side surface 118. First portion 422A and second portions 422B may form a continuous tab 422 to allow airflow through opening 426 only from the bottom of vent 420. First portion 422A may be configured at an angle relative to top surface 116 or curved as depicted in FIG. 4. Second portions 422B may be bent at an angle relative to side surface 118 or curved as depicted in FIG. 4. Vent 420 formed from tab 422 comprising first portion 422A and second portion 422B may airflow to pass through opening 426 but tab 122 may prevent electromagnetic energy emitted by components 20 from entering or exiting opening 426. As depicted in FIG. 4, vents 420 may be formed in one or more side surfaces 118 of EMI shield 114 to align openings 426 with one or more openings 132 in frame 130.

Referring to FIG. 5, vent 520 may be formed in side surface 118 of EMI shield 114 with a first portion 522A of tab 522 extending from top surface 116 and configured with an angle relative to top surface 116 to form second portion 522B extending generally parallel with side surface 118 such that airflow may pass through opening 526 but tab 522 may prevent electromagnetic energy emitted by components 20 from entering or exiting opening 526. As depicted in FIG. 5, vents 520 may be formed in one or more side surfaces 118 of EMI shield 114 to align with openings in frame 130. Vent 520 depicted in FIG. 5 may be configured to allow airflow around components 20 and pass through the side or bottom of vent 520.

EMI Shield with Vents Allows Increased Cooling of Components

Figure 6A:
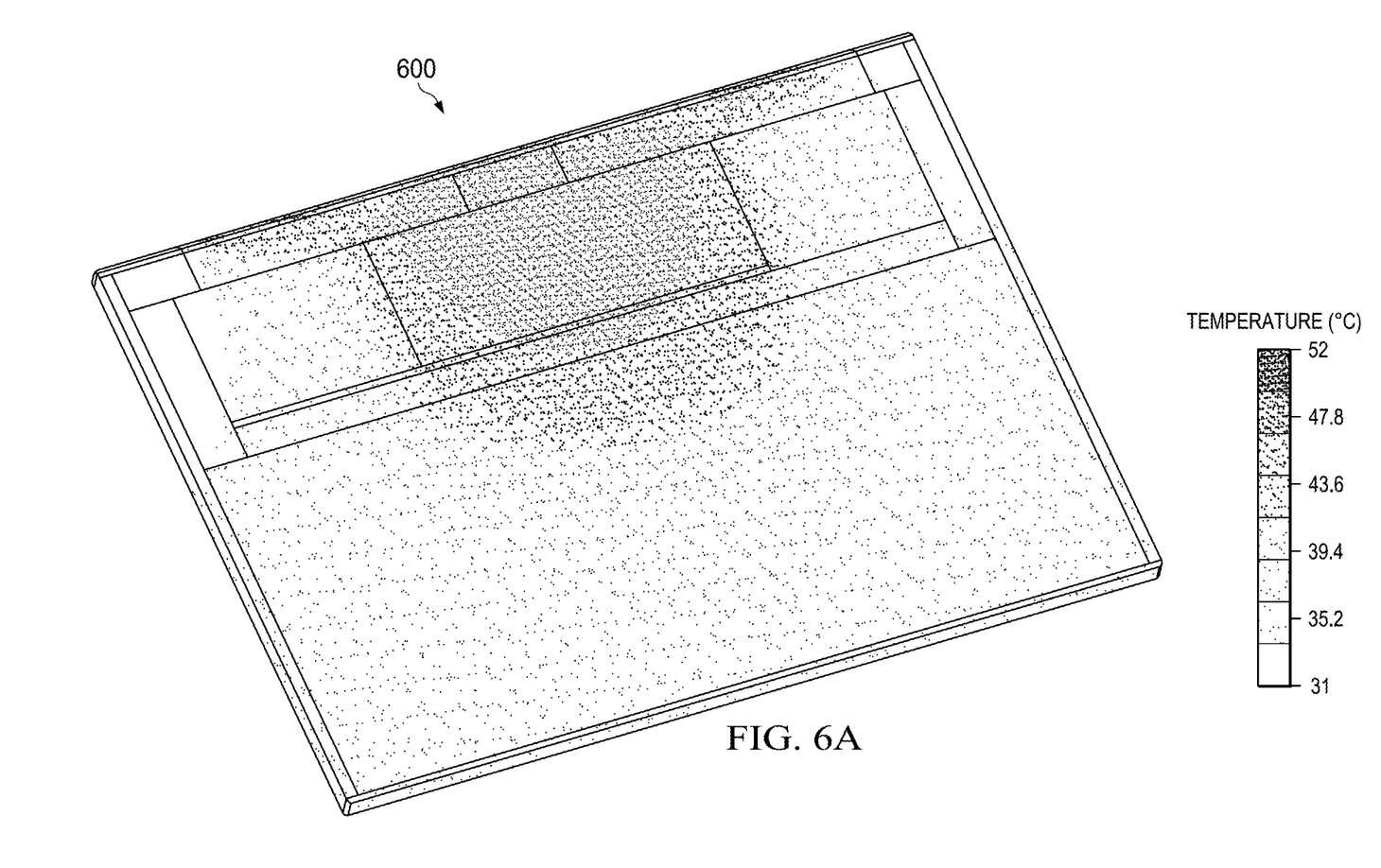
FIG. 6A depicts an image of temperature values for an information handling system in a sealed chassis using a standard EMI shield.

FIG. 6A depicts a simulated temperature profile 600 for an information handling system in a sealed chassis using a standard EMI shield. DOO fans 112 generate airflow in chassis 110. However, a standard EMI shield having continuous top surface 114 and side surfaces 118 may restrict airflow through chassis 110, resulting in temperature profile 600 having defined portions of a temperature gradient proportional to the size of EMI shield 114.

Figure 6B:
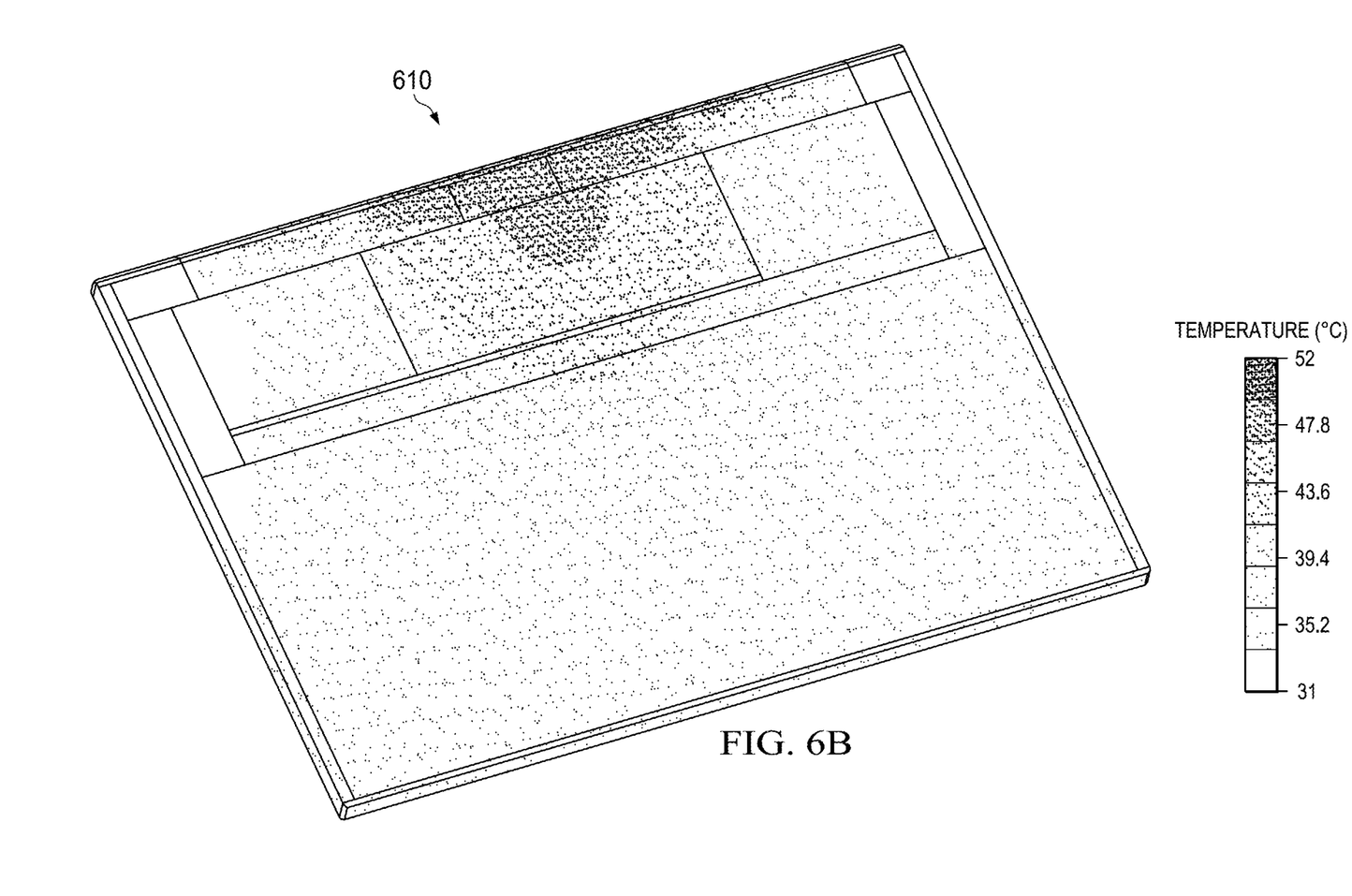
FIG. 6B depicts an image of temperature values for an information handling system in a sealed chassis using an EMI shield configured with vents according to embodiments disclosed herein.

FIG. 6B depicts a simulated temperature profile 610 for an information handling system in a sealed chassis 110 using embodiments of EMI shield 114 configured with vents 320, 420 or 520 in one or more side surfaces 118 according to embodiments disclosed herein. An airflow may be generated in a sealed chassis (such as generated by DOO fans 112 in sealed chassis 110 described above) and vents 320, 420 or 520 allow the airflow to pass through EMI shield 114 for cooling components 20 shielded by EMI shield 114. As a result, a simulated temperature profile 610 for embodiments disclosed herein indicates components 20 in information handling systems 100 experience lower operating temperatures when protected by EMI shield 114 having vents 320, 420 or 520.

EMI Shield with Vents in Side Surface Protects Components from EMI

EMI shield 114 configured with vents 320, 420 or 520 in one or more side surfaces 118 prevents electromagnetic energy from affecting components 20 of information handling system 100.

Figure 7:
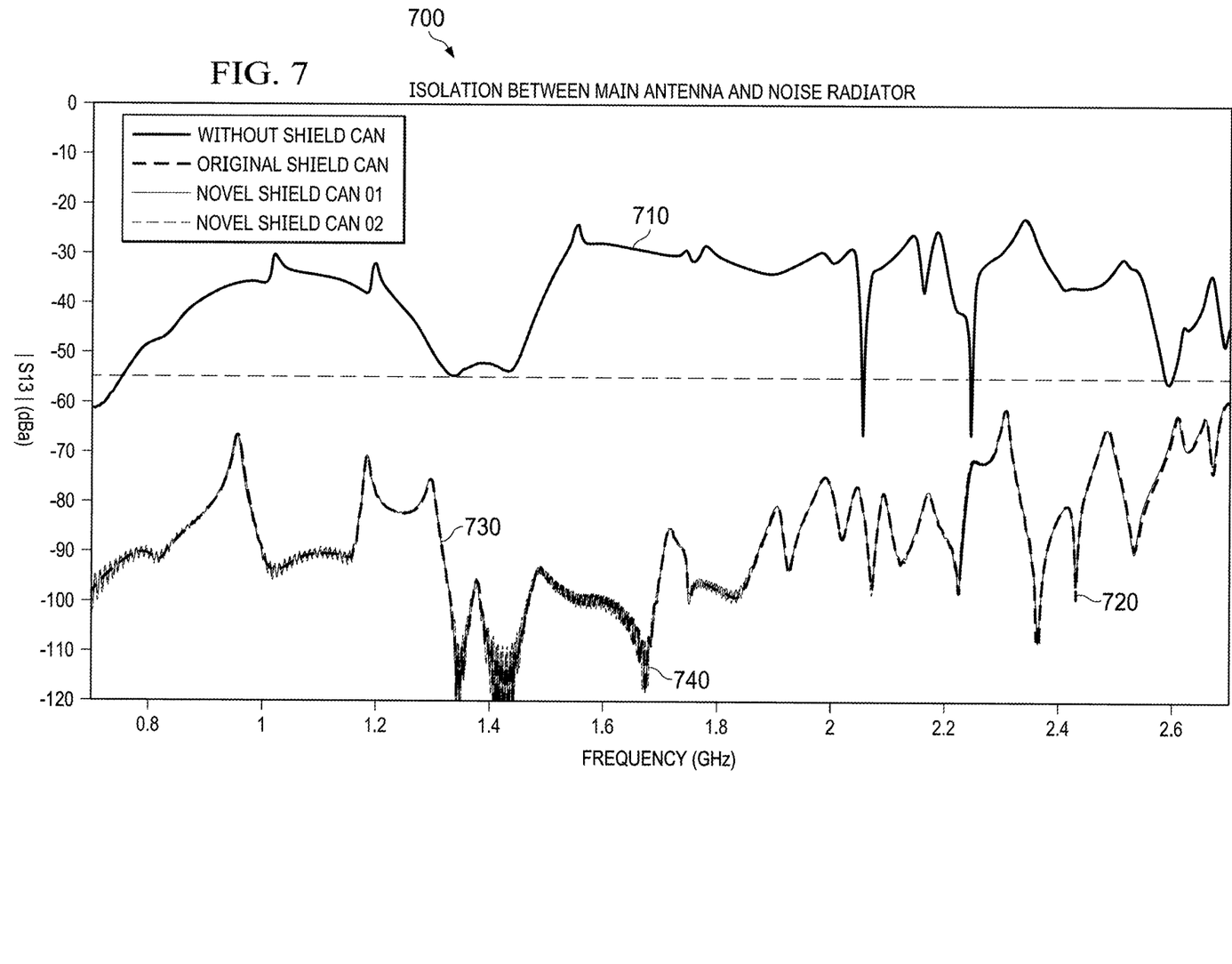
FIG. 7 is a graph depicting noise values for a portable information handling system configured with a standard EMI shield and embodiments of an EMI shield according to embodiments disclosed herein.
Figure 8:
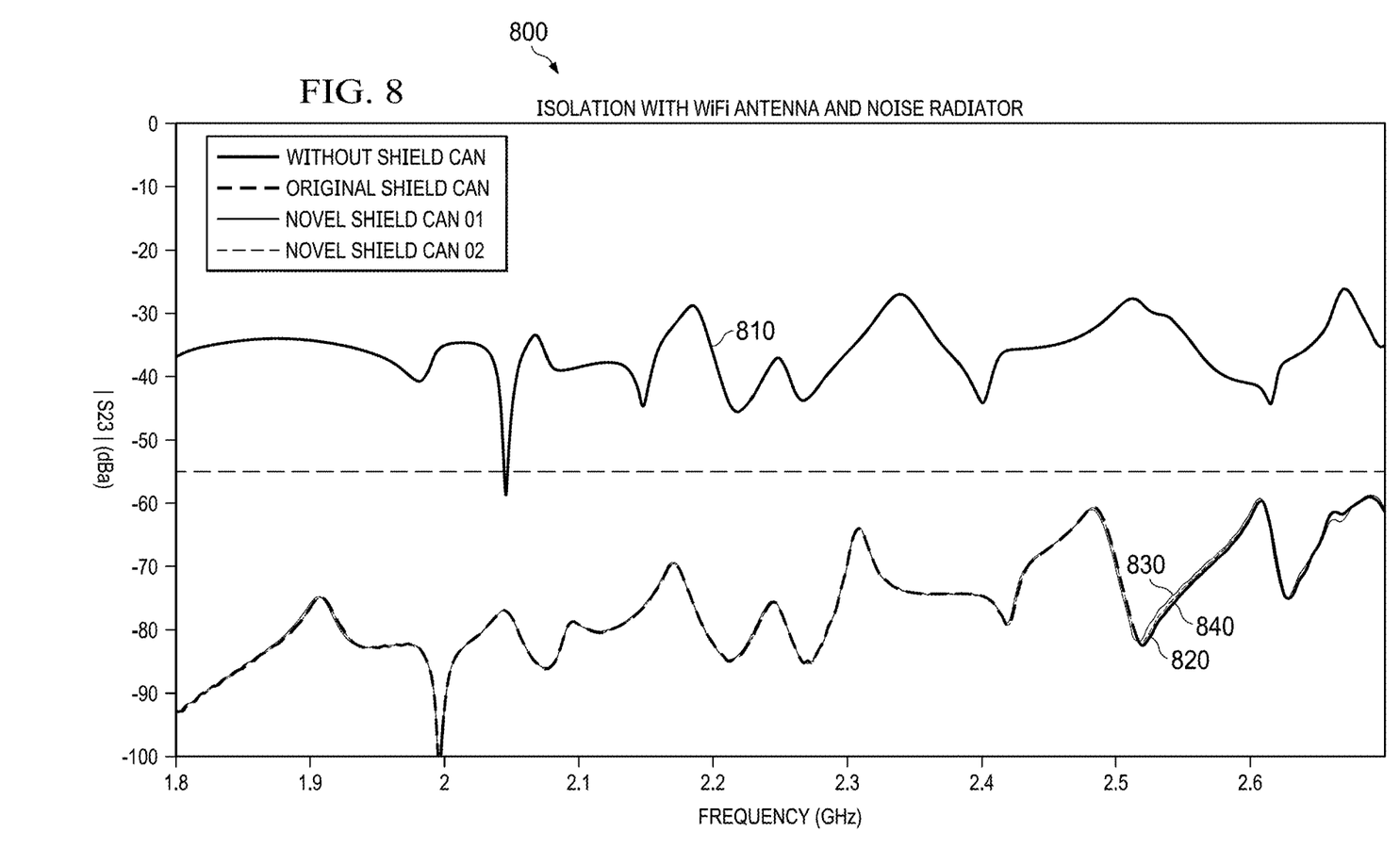
FIG. 8 is a graph depicting noise values for a portable information handling system configured with a standard EMI shield and embodiments of an EMI shield according to embodiments disclosed herein.

FIGS. 7 and 8 depict simulated noise profiles for information handling system 100 in a sealed chassis with two DOO fans 112 generating airflow through chassis 110.

FIG. 7 depicts graph 700 depicting noise values over a range of frequencies generated by a noise radiator and experienced by a main antenna 20-5 in a portable information handling system configured with a standard EMI shield having no openings and EMI shield 114 with vents 320, 420 and 520 according to embodiments disclosed herein. Line 710 depicts noise values (in decibels (dB)) detected in sealed chassis 110 of portable information handling system 100 configured with two DOO fans 112 and a common EMI shield formed with continuous side surfaces.

Line 720 depicts noise values (in decibels (dB)) detected in sealed chassis 110 of portable information handling system 100 configured with two DOO fans 112 and EMI shield 114 formed with vents 120 such as vents 320 depicted in FIG. 3.

Line 730 depicts noise values (in decibels (dB)) detected in sealed chassis 110 of portable information handling system 100 configured with two DOO fans 112 and EMI shield 114 formed with vents 120 such as vents 420 depicted in FIG. 4.

Line 740 depicts noise values (in decibels (dB)) detected in sealed chassis 110 of portable information handling system 100 configured with two DOO fans 112 and EMI shield 114 formed with vents 120 such as vents 520 depicted in FIG. 5.

Generally, EMI shield 114 having vents 320, 420 or 520 formed therein reduces the amount of electromagnetic energy that can reach main antenna 20-5. Further reductions in the amount of electromagnetic energy that can reach antenna 20-5 may depend on the placement of a particular vent 320, 420 or 520 relative to the noise radiator or main antenna 20-5.

FIG. 8 depicts graph 800 depicting noise values over a range of frequencies generated by a noise radiator and experienced by a Wi-Fi antenna 20-5 in a portable information handling system configured with a standard EMI shield having no openings and EMI shield 114 with vents 320, 420 and 520 according to embodiments disclosed herein.

Line 810 depicts noise values (in decibels (dB)) generated by a noise radiator in sealed chassis 110 of portable information handling system 100 configured with two DOO fans 112 and EMI shield 114 formed with no vents.

Line 820 depicts noise values (in decibels (dB)) detected in sealed chassis 110 of portable information handling system 100 configured with two DOO fans 112 and EMI shield 114 formed with vents 320 depicted in FIG. 3.

Line 830 depicts noise values (in decibels (dB)) detected in sealed chassis 110 of portable information handling system 100 configured with two DOO fans 112 and EMI shield 114 formed with vents 420 depicted in FIG. 4.

Line 840 depicts noise values (in decibels (dB)) detected in sealed chassis 110 of portable information handling system 100 configured with two DOO fans 112 and EMI shield 114 formed with vents 520 depicted in FIG. 5.

Generally, EMI shield 114 having vents 320, 420 or 520 formed therein reduces the amount of electromagnetic energy that can reach Wi-Fi antenna 20-5. Further reductions in the amount of electromagnetic energy that can reach Wi-Fi antenna 20-5 may depend on the placement of a particular vent 320, 420 or 520 relative to the noise radiator or Wi-Fi antenna 20-5.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A system for cooling a plurality of components of a portable information handling system in a sealed chassis, the plurality of components comprising a first set of components that emit electromagnetic energy and a second set of components that are affected by electromagnetic energy, the system comprising:
  a hyperbaric fan for generating an airflow in the sealed chassis;
  an electromagnetic interference (EMI) shield comprising a material configured to prevent electromagnetic energy transmission, wherein the EMI shield is formed into a continuous top surface and a plurality of side surfaces, wherein
    at least one side surface is positioned between the first set of components and the second set of components,
    the at least one side surface is formed with a plurality of vents, wherein each vent comprises an opening that defines an airflow path to the second set of components and a tab extending from the top surface and covering the opening to prevent direct transmission of electromagnetic energy from the first set of components to the second set of components.

2. The system of claim 1, wherein the tab comprises:
  a first portion that extends a first distance from the top surface;
  an angled bend; and
  a second portion extending from the angled bend.

3. The system of claim 2, wherein the second portion of the tab is configured to accommodate a component of the plurality of components.

4. The system of claim 1, wherein the tab comprises a curvature.

5. The system of claim 4, wherein the curvature has a constant radius.

6. The system of claim 1, further comprising a frame for supporting the EMI shield, wherein
  the frame comprises a plurality of openings on a side; and
  the plurality of vents on the EMI shield are aligned with the plurality of openings in the frame.

7. The system of claim 1, wherein the first set of components comprises a processor and the second set of components comprises an antenna.

8. A portable information handling system comprising:
  a plurality of components in a sealed chassis, the plurality of components comprising a first set of components that emit electromagnetic energy and a second set of components that are affected by electromagnetic energy;
  a system for cooling the plurality of components, the system comprising:
    a hyperbaric fan for generating an airflow in the sealed chassis;
    an electromagnetic interference (EMI) shield comprising a material configured to prevent electromagnetic energy transmission, wherein the EMI shield is formed into a continuous top surface and a plurality of side surfaces, wherein
      at least one side surface is positioned between the first set of components and the second set of components,
      the at least one side surface is formed with a plurality of vents, wherein each vent comprises an opening that defines an airflow path to the second set of components and a tab extending from the top surface and bent over the opening to prevent direct transmission of electromagnetic energy from the first set of components to the second set of components.

9. The portable information handling system of claim 8, wherein the tab comprises:
  a first portion that extends a first distance from the top surface;
  an angled bend; and
  a second portion extending from the angled bend.

10. The portable information handling system of claim 9, wherein the second portion of the tab is raised to accommodate a component of the plurality of components.

11. The portable information handling system of claim 8, wherein the tab comprises a curvature.

12. The portable information handling system of claim 11, wherein the curvature has a constant radius.

13. The portable information handling system of claim 8, further comprising a frame for supporting the EMI shield, wherein
  the frame comprises a plurality of openings on a side; and
  the plurality of vents on the EMI shield are aligned with the plurality of openings in the frame.

14. The information handling system of claim 8, wherein the first set of components comprises a processor and the second set of components comprises an antenna.

15. A method for cooing a plurality of components in a portable information handling system, the method comprising:
  positioning a hyperbaric fan configured for generating an airflow to cool the plurality of components;
  forming, from a material configured to prevent electromagnetic energy transmission, an electromagnetic interference (EMI) shield, comprising:
    forming a continuous top surface;
    forming a plurality of side surfaces; and
    forming a plurality of vents in at least one side surface, wherein forming a vent comprises forming an opening that defines an airflow path to the second set of components and forming a tab extending from the top surface over the opening to prevent transmission of electromagnetic energy from the first set of components to the second set of components;
  positioning the EMI shield in the chassis such that the at least one side surface is positioned between the first set of components and the second set of components; and
  sealing the chassis.

16. The method of claim 15, wherein forming the tab comprises:
   forming a first portion that extends a first distance from the top surface; and
   bending a second portion at an angle relative to the first portion, wherein the second portion extends substantially parallel with the side surface.

17. The method of claim 16, wherein forming the tab comprises forming the second portion to accommodate a component of the plurality of components.

18. The method of claim 15, wherein forming the tab comprises bending the tab with a curvature.

19. The method of claim 15, further comprising:
   forming a frame with a plurality of openings; and
   coupling the EMI shield to the frame, wherein the plurality of vents on the EMI shield are aligned with the plurality of openings in the frame.

20. The method of claim 15, wherein
   the first set of components comprises a processor and the second set of components comprises an antenna; and
   positioning the EMI shield in the chassis such that the at least one side surface is positioned between the first set of components and the second set of components comprises positioning the EMI shield between the antenna and the processor.

\* \* \* \* \*